(12) United States Patent
Oddou et al.

(10) Patent No.: US 6,617,676 B1
(45) Date of Patent: Sep. 9, 2003

(54) METHOD FOR MAKING A CONTACTLESS CHIP CARD

(75) Inventors: Laurent Oddou, La Ciotat (FR); Stéphane Ayala, Marseilles (FR); Michael Zafrany, Marseilles (FR)

(73) Assignee: Gemplus, Gemenos (FR)

( * ) Notice: Subject to any disclaimer, the term of this patent is extended or adjusted under 35 U.S.C. 154(b) by 0 days.

(21) Appl. No.: 09/868,570

(22) PCT Filed: Nov. 29, 1999

(86) PCT No.: PCT/FR99/02942

§ 371 (c)(1),
(2), (4) Date: Aug. 8, 2001

(87) PCT Pub. No.: WO00/38111

PCT Pub. Date: Jun. 29, 2000

(30) Foreign Application Priority Data

Dec. 21, 1998 (FR) .............................. 98 16140

(51) Int. Cl.[7] .................. H01L 29/80; H01L 31/112; H01L 23/02; H01L 25/58
(52) U.S. Cl. ................... 257/679; 257/922; 257/276
(58) Field of Search ................ 257/679, 922, 257/276, 275, 277, 528, 531, 725, 728, 724

(56) References Cited

U.S. PATENT DOCUMENTS 5,598,032 A * 1/1997 Fidalgo ............... 257/679

FOREIGN PATENT DOCUMENTS

| DE | 19633923 | 2/1998 | |
|----|----------|--------|----|
| EP | 0682321 | 11/1995 | |
| EP | 0737935 | 10/1996 | |
| WO | WO 97/26621 | * 7/1997 | ............... 19/77 |

* cited by examiner

Primary Examiner—Nathan J. Flynn
Assistant Examiner—Victor A. Mandala, Jr.
(74) Attorney, Agent, or Firm—Burns, Doane, Swecker & Mathis, L.L.P.

(57) ABSTRACT

A method for making a contactless chip card of the type having an electronic module, and an antenna connected to the module, includes the following steps: producing, on a first support sheet, the antenna with connection terminals provided at its ends; producing an insulating bridge partly covering the antenna coils except for the connection terminals; depositing a drop of filling material on the insulating bridge; transferring the electronic module, with its connection pads being oriented towards the insulating bridge; and providing an electric connection between the module contact pads and the antenna connection terminals.

17 Claims, 4 Drawing Sheets

METHOD FOR MAKING A CONTACTLESS CHIP CARD

This disclosure is based upon, and claims priority from French Application No. 98/16140, filed on Dec. 21, 1998 and International Application No. PCT/FR99/02942, filed Nov. 29, 1999, which was published on Jun. 29, 2000 in a language other than English, the contents of which are incorporated herein by reference.

BACKGROUND OF THE INVENTION

The present invention concerns the field of portable items such as contactless chip cards having a card body, an electronic module and, connected to said module, an antenna. The invention concerns more particularly a method for making such cards.

Such cards are designed for carrying out diverse operations such as, for example, banking operations, telephone communications, or diverse identification operations. They are designed, in particular, for remote transaction operations in which they are debited remotely by a certain number of units when passed close to a terminal and where they can also be recharged remotely.

These operations take place by means of remote electromagnetic coupling (in general of inductive type) between the card electronics and a receiving device or reader. This coupling takes place in read mode or in read/write mode and the data transmission takes place by means of radio-frequencies or ultrahigh frequencies.

Chip cards, whether with and/or without contacts, are produced to standardized dimensions. A common standard, but not limitative for the present invention, is that referred to as ISO 7810 which corresponds to a card of standard format, 85 mm in length, 54 mm in width, and 0.76 mm thick.

A method of producing contactless chip cards using a cold lamination technique is known. Such a method is shown schematically in FIG. 1A. In this case, an electronic assembly, also referred to as a transponder, composed of an antenna 5 made of a wound wire connected to an electronic module 7, is disposed above a first plastic sheet 1. Then a liquid resin 8, for example made of polyurethane, is dispensed so as to embed the electronic assembly. A final step then consists of covering the resin 8 with an upper plastic sheet 6 and then of performing a cold lamination in order to weld the resin 8 to the lower sheet 1 and upper sheet 6.

In a variant implementation illustrated in FIG. 1B, the electronic assembly can be composed of a printed circuit type wafer 30 comprising an antenna 31, produced by lamination, overlaying, etching or silk screen printing, and a chip or a module 40 connected to said antenna 31.

In both these cases, connection of the module to the antenna is carried out by means of a tin/lead solder, by an ultrasonic weld, by thermocompression or by means of a conductive glue for example.

This method, whatever the variant used, has however a number of drawbacks. A first drawback is related to the fact that the electronic assembly is not fully immovably attached to one of the outer sheets of the card. Consequently, sometimes the indexing of the electronic assembly is shifted with respect to the outer sheets. This shift can lead to the cutting and destruction of the electronic assembly, at the time the sheets are cut to the card format, when said sheets were not cut beforehand. In addition, the manipulation of three independent elements is necessary: two outer sheets 1 and 6 and an electronic assembly.

Moreover, when the liquid resin is being dispensed, air bubbles form around the electronic assembly. These air bubbles lead to the creation of defects at the surface of the card. These surface defects are not only unsightly but they also involve difficulties during the printing step for decorating and personalizing the card. This is because the surface defects create depressions which locally prevent the transfer of material, with the result that it is difficult to produce a good quality print over the whole surface of the cards. These surface defects also have a tendency to spread and grow larger during ageing of the card, as a result of temperature variations undergone by said card.

Another method for making contactless chip cards which has been envisaged by the inventors is illustrated in FIG. 2. This method consists of producing an antenna 11 on the face of one of the two outer sheets 10 and then of connecting a chip 20 to the antenna. The antenna 11 is for example produced by silk screen printing, lamination or overlaying of a conductive wire. It comes in the form of a spiral, at the ends of which there are provided connection terminals 15. The chip 20 is for example transferred so that its non-active rear face is directly glued to the antenna by means of an insulating glue 25. An electrical connection is made by means of an electrically conductive resin 27 which is dispensed on to both the connection terminals 15 and the contact pads 21. A liquid resin 18 is then dispensed on to the electronic assembly, and then an upper sheet 16 is transferred and welded to the first sheet 10 by cold lamination. In this case, the number of independent elements manipulated is reduced to 2. These elements are constituted by the first outer sheet 10, immovably attached to the electronic assembly, and by the second outer sheet 16.

This method, however, would also have drawbacks. It would not allow, notably, the use of a module under good operating conditions, but only that of a chip. This is because, if a module were used, it would be transferred so that its metallic grid, having contact areas, is oriented towards the tracks of the antenna. An insulating glue makes it possible to fix the module on to the tracks of the antenna while avoiding the appearance of short circuits between this antenna and the metallic grid of the module. Contact areas of the metallic grid of the module are directly connected to the connection terminals of the antenna. However, in this case, it would be very difficult to have control over the insulation, on the one hand between the tracks of the antenna, and on the other hand, between the antenna and the metallic grid of the module.

Finally, the insulating glue, used for fixing the module and insulating it electrically from the antenna turns, is not always distributed correctly between the tracks of the antenna, with the result that air bubbles can form around the module. These air bubbles lead to the creation of defects at the surface of the card, which are unsightly and involve difficulties during the card printing and personalization step.

SUMMARY OF THE INVENTION

One aim of the invention consists of making a contactless chip card, having an electronic module connected to an antenna, the production of this card requiring the manipulation only of two independent elements, and making it possible to overcome the drawbacks related to the methods of the prior art.

A more particular object of the invention is a method for making a contactless chip support, comprising an electronic assembly, having an antenna and at least one microcircuit connected to the antenna, said electronic assembly being embedded in a body of the support composed of laminated sheets, characterised in that it has the following steps:

producing the antenna on a first support sheet, said antenna forming a spiral at the ends of which there are provided connection terminals, producing an insulating bridge partly covering the antenna turns with the exception of at least part of the connection terminals, depositing a drop of filling material on the insulating bridge, transferring the microcircuit against the insulating bridge and the filling material, and establishing an electrical connection from the microcircuit to the connection terminals of the antenna.

According to another characteristic, the method has a step consisting of:

transferring a second sheet against the previously formed electronic assembly and performing a lamination of said first and second sheets.

By virtue of the method according to the invention, there are only two independent elements left to be manipulated, that is to say the two outer sheets. Since the electronic assembly is immovably attached to one of the outer sheets, the indexing problems are no longer posed. The insulating bridge provides electrical insulation of the antenna tracks and of the metallic grid of the module. It also makes it possible to drive out the residual air located between the tracks of the antenna. The filling material fills in the space between the module and the insulating bridge and makes it possible to drive out the residual air around the module. With the residual air being driven out, the appearance of air bubbles and surface defects is avoided.

The filling material is for example a cyanoacrylate-based glue.

According to another characteristic of the invention, the insulating bridge has a substantially rectangular form and has two notches at two given locations in order to allow exposure of the connection terminals of the antenna. This insulating bridge is preferably produced by silk screen printing of a liquid resin, and then polymerization under ultraviolet radiation. It preferably has a thickness between 15 and 60 $\mu$m.

According to another characteristic of the invention, the electrical connection between the module and the antenna is implemented by means of an electrically conductive glue which is deposited on the connection terminals of the antenna.

According to another characteristic of the invention, the electronic module can also be replaced by an integrated circuit chip.

According to another characteristic, the microcircuit is placed in an electronic module so that the metallic contact areas are disposed against the insulating bridge and the filling material.

Another object of the invention also concerns a contactless chip card, having an electronic assembly constituted by an electronic module and, connected to said module, an antenna, said electronic assembly being embedded in the body of the card, characterised in that the electronic assembly is fixed on a first support sheet, the antenna being produced on said first support sheet, and the module being transferred so that its metallic contact areas are disposed facing the antenna turns; an insulating bridge, covered with a filling material, being disposed between the module and the turns of the antenna, said insulating bridge having a geometry such that it does not cover the connection terminals of the antenna in order to allow the establishment of an electrical connection with the electronic module.

BRIEF DESCRIPTION OF THE DRAWINGS

Other features and advantages of the invention will emerge from a reading of the following description given by way of an illustrative but non-limitative example and produced with reference to the accompanying figures which depict.

DETAILED DESCRIPTION

Figure 1A:
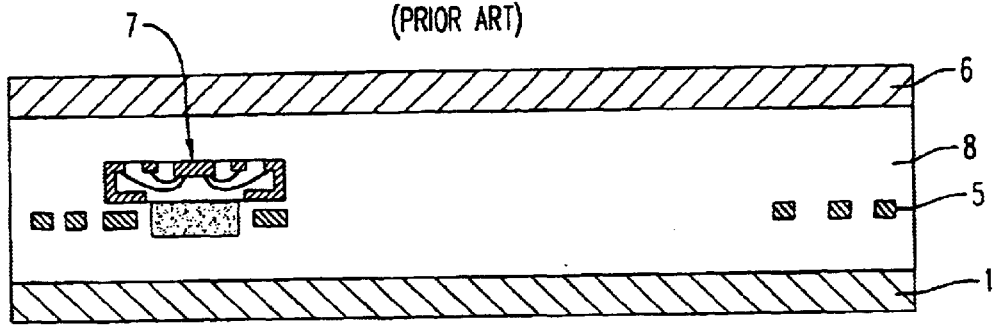
FIGS. 1A and 1B, already described, two longitudinal sectional views of two contactless chip cards produced according to two variants of a known method of the prior art, FIG. 2, already described, a longitudinal sectional view of another contactless chip card envisaged according to another method, FIGS. 3A and 3B, respectively a longitudinal sectional view and a top view of a contactless chip card during a first step of the manufacturing method according to the invention, FIG. 4, a longitudinal sectional view of the contactless chip card of FIGS. 3A and 3B at another stage of its manufacture, FIGS. 5A to 5D, top views showing schematically the steps of producing an insulating bridge above an antenna, with a view to preparing for the transfer of a module, FIG. 6, a longitudinal sectional view of the contactless chip card of FIGS. 3A to 4, at a final stage of its manufacturing method, FIG. 7, a longitudinal sectional view of another chip card, according to a variant embodiment, at a final stage of its manufacturing method.
Figure 1B:
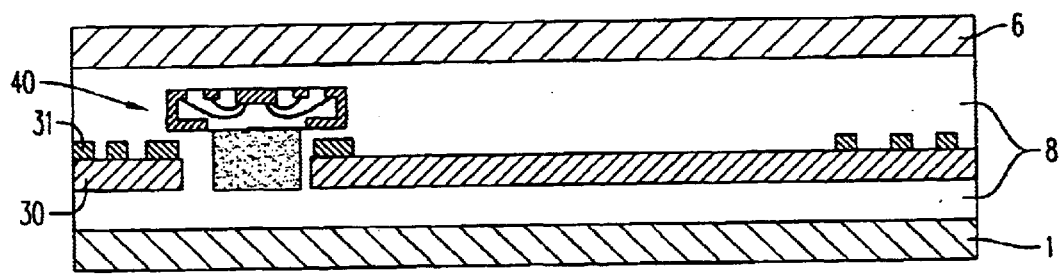
Figure 2:
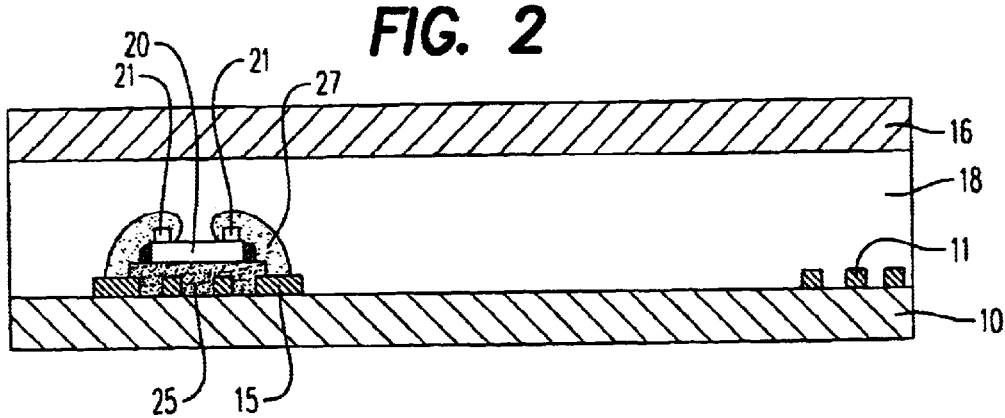
Figure 3A:
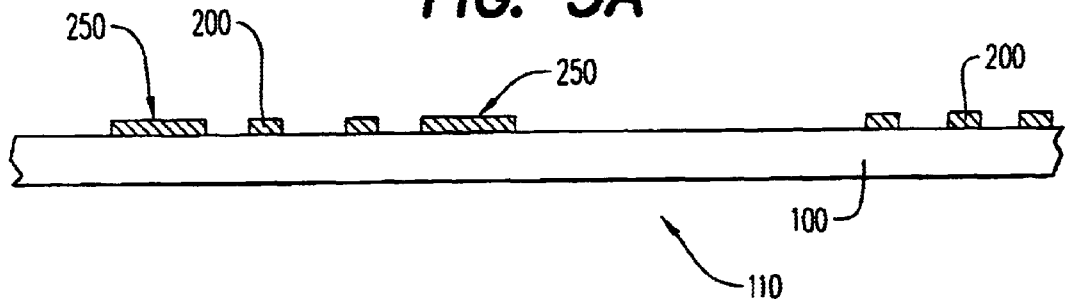
Figure 3B:
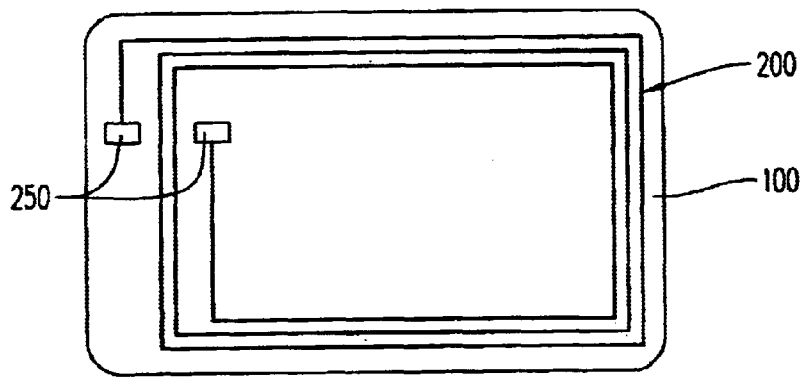

A first step of the manufacturing method according to the invention consists of producing an antenna 200 on a substrate 100 (FIGS. 3A and 3B). The substrate 100 is made of plastic, for example polyvinyl chloride (PVC). It can be any support and come notably in the form of a strip, or a large sheet. In this case, it can be cut to the card format, at any stage whatsoever of the manufacturing method. In a variant, it can also be cut beforehand to the card format. In the example illustrated in FIGS. 3A and 3B, this substrate is already cut to the card format, before production of the antenna, and comes in the form of a sheet. Its thickness is for example between 100 and 200 $\mu$m. The face 110 opposite the one which supports the antenna 200 is designed to form an outer surface of the card body.

The antenna 200 is for example produced by silk screen printing of conductive ink, such as a silver ink for example. This ink is then dried at a temperature of the order of 60° C. for a period between around 2 and 15 minutes. In a variant embodiment, the antenna can also be produced according to other known techniques such as the overlaying of a conductive wire or the etching of a copper or aluminium film for example. It comes in the form of a spiral and comprises at least two turns. Typically, the conductive tracks of the antenna have a width between 0.15 and 3 mm, and are spaced apart from one another by a value between 0.15 and 2 mm.

The thickness of the antenna is for example between 10 and 40 $\mu$m. The antenna 200 has moreover, at its ends, two connection terminals 250 designed to allow electrical connection with an electronic module. The spacing between these connection terminals 250 is preferably between 2 and 15 mm. In addition, the antenna is produced in the form of a spiral so that the antenna turns pass between the connection terminals 250.

Figure 4:
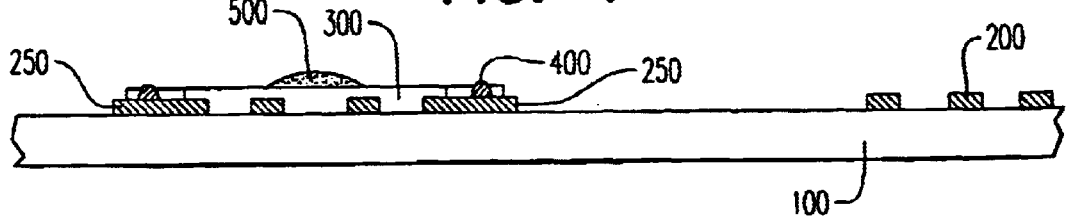
Figure 5:
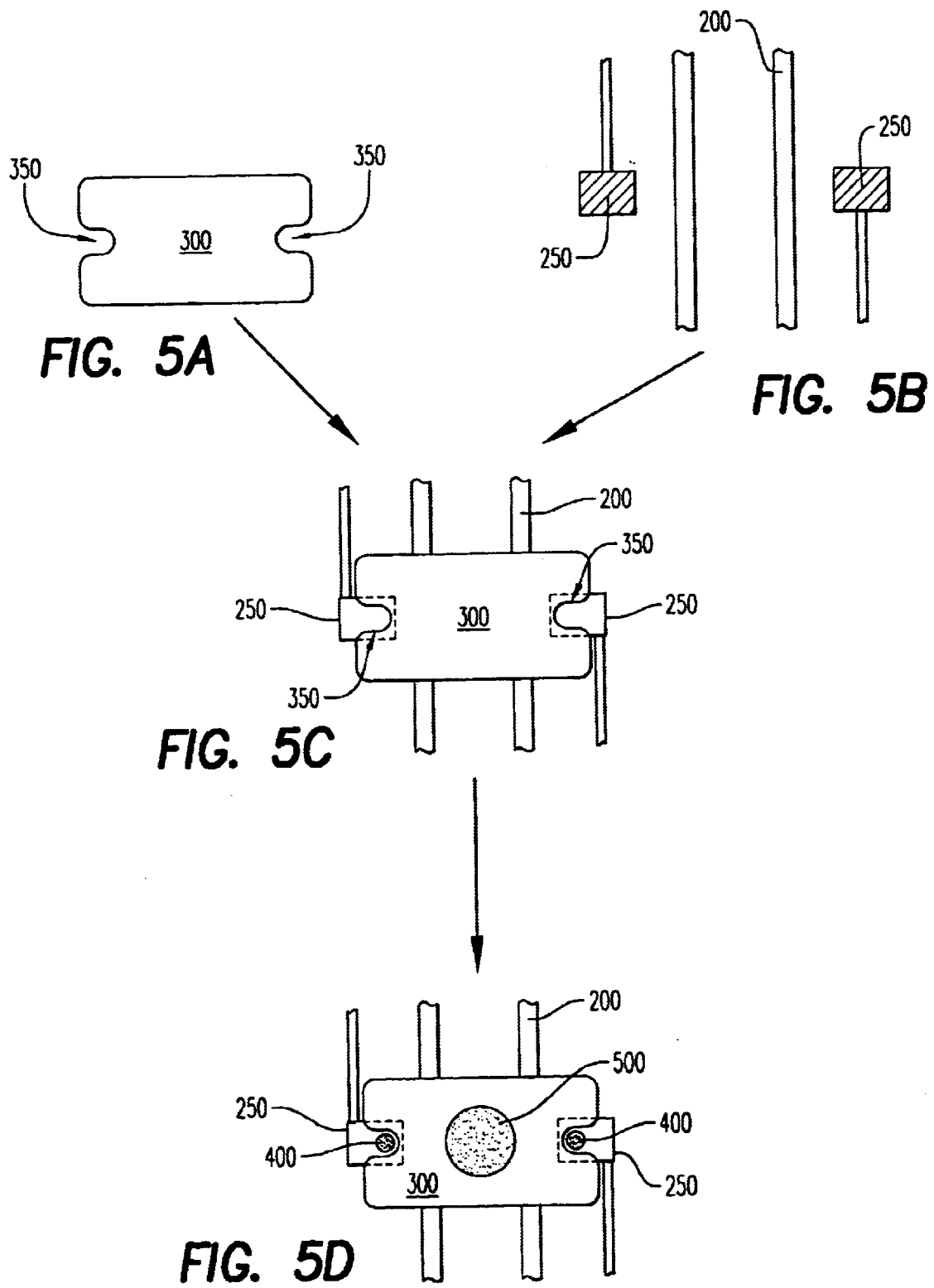

The next step of the method of making the contactless chip card according to the invention, illustrated in FIG. 4, consists of producing an insulating bridge 300 partly covering the antenna turns 200 with the exception of the connection terminals 250. The insulating bridge 300 is produced in a dielectric material coming for example in the form of a liquid resin, such as for example the resin marketed under the reference CB018 by the Dupont company of Nemours. This insulating bridge 300 provides an electrical insulation between the tracks of the antenna 200 passing between the connection terminals 250 of this antenna. In addition, it makes it possible to avoid the creation of short circuits between the antenna and the electronic module, upon transfer of said electronic module. The role and advantages of this insulating bridge are explained in more detail in the remainder of the description relating to the electronic module transfer step.

This insulating bridge 300 is produced over a thickness sufficient to correctly cover the antenna turns. Thus, its overall thickness is preferably between 15 and 60 $\mu$m in order to cover the antenna turns over a thickness between 5 and 20 $\mu$m.

The insulating bridge 300 is for example produced by silk screen printing of the liquid resin. This silk screen printing makes it possible to provide both a deposit with a well-defined geometry and filling of the spaces located between the tracks of the antenna, the air in these spaces then being driven out of these spaces by the resin. Following this silk screen printing, a polymerization under ultraviolet radiation allows solidification of the insulating bridge. In a variant embodiment, the insulating bridge can also be obtained by spraying of the liquid resin.

FIGS. 5A to 5D show schematically a preferred geometry of this insulating bridge 300 and its disposition on the antenna turns 200. The insulating bridge 300 is produced in a substantially rectangular form and has two notches 350. These two notches 350 are disposed on the lateral sides of the insulating bridge, in an area provided to be superposed on the connection terminals 250 of the antenna 200.

Thus, the insulating bridge 300 makes it possible to cover an area of the antenna turns 200, located between the connection terminals 250, while leaving at least part of said connection terminals 250 exposed by means of the notches 350.

A next step of the method then consists of depositing a conductive material 400 on the connection terminals 250 of the antenna 200 with a view to producing an electrical connection between an electronic module and the antenna. This conductive material 400 consists for example of a glue containing conductive particles of silver.

Moreover, a drop of filling material 500, of around 1 to 3 mm in diameter for example, is dispensed at the centre of the insulating bridge 300. This material can for example consist of a cyanoacrylate-based insulating glue for example. The filling material must be capable of spreading out and filling the space between the insulating bridge 300 and the module when said module is transferred at the step below. The filling of this space avoids the residual air at the origin of the appearance of air bubbles which lead to surface defects. In a variant embodiment, this filling material 500 can be deposited in the form of a rectilinear path. The filling drop is deposited preferably after the conductive material 400.

Figure 6:
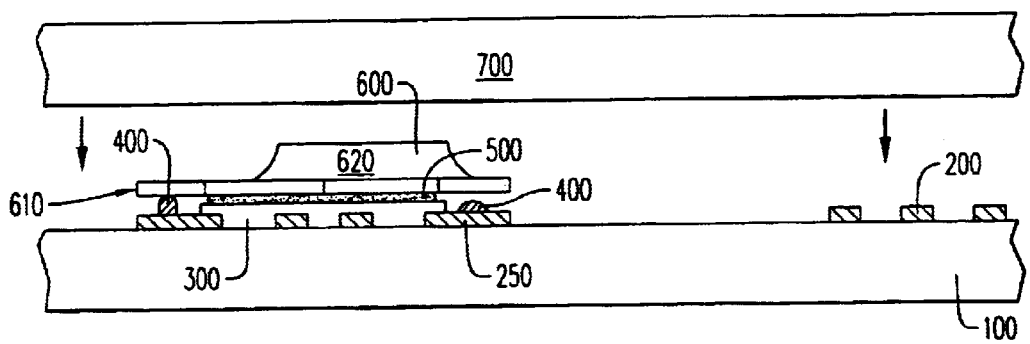

An electronic module 600 is then transferred on top of the insulating bridge 300 covering the antenna turns 200 (see FIG. 6). The module 600 used is a conventional module, which comprises an integrated circuit chip whose contact pads are connected, notably by means of conductive wires, to the contact areas of a metallic grid 610 made of nickel-plated and gold-plated copper. The chip and the conductive wires are furthermore protected by an encapsulation resin 620. The module 600 is transferred so that its metallic grid 610, having its contact areas, is applied facing the insulating bridge 300 and the filling material 500. The dimensions of the module 600 to be transferred are variable, the length is for example between 3 and 20 mm and the width is also for example between 3 and 20 mm. It has at least 2 separate contact areas disposed in the example at the opposite ends of the module facing the connection terminals 250 of the antenna. The contact areas can possibly rest on a support film in a manner known per se.

The module 600 is transferred by application of pressure to its predefined location. Under the effect of the applied pressure, the filling material 500, cyanoacrylate-based for example, flows and spreads out under the module 600. By spreading out, it thus drives out the residual air which might be located in the space situated between the insulating bridge and the module and lead to the appearance of surface defects. This insulating filling material also makes it possible to provide a fixing of the module by gluing but this function is not essential; its principal role consists in fact of avoiding any empty space under the module, that is to say avoiding any presence of residual air.

The major part of the mechanical hold of the module on the antenna is provided by the connection material 400. In the example, this connection material 400 is constituted by a conductive glue. The spreading out of this conductive material 400 is controlled and guided by the specific geometry of the insulating bridge and notably by the notches 350. These notches in fact avoid the conductive material spreading out at the surface of the insulating bridge 300 and leading to the appearance of short circuits between the contact areas of the module, during its transfer. The conductive glue is then polymerized for, for example, around 8 hours at a temperature of around 60° C. This polymerization makes it possible to weld the assembly and establish a good quality electrical connection. In a variant, it is also possible to envisage making this electrical connection between the module and the antenna by means of a tin/lead solder for example.

Figure 7:
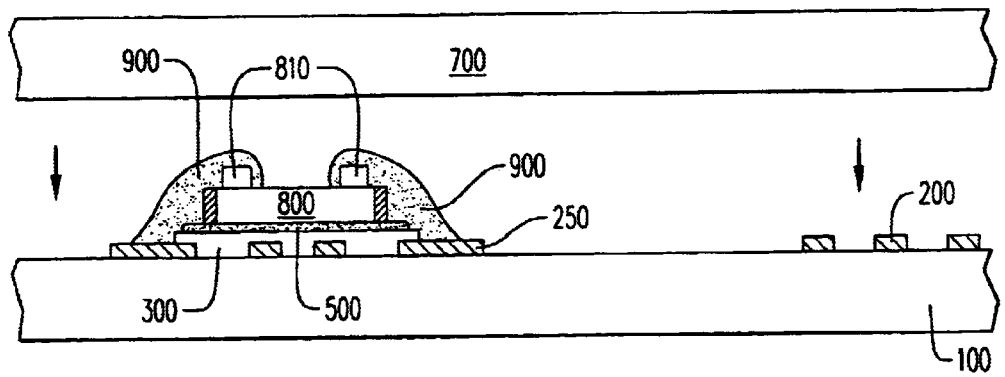

In a variant embodiment, the module can also be replaced by an integrated circuit chip. This variant is illustrated in FIG. 7. In this case, the chip 800 is transferred so that its non-active rear face is applied against the insulating bridge 300 and the filling material 500. A deposit of conductive resin 900 then makes it possible to make the electrical connection between the contact pads 810 of the chip 800 and the connection terminals 250 of the antenna 200.

The electronic assembly, constituted by the module 600 (or the chip 800) connected to the antenna 200, is then fully made and directly fixed on to the support sheet 100. It is therefore firmly attached to the support sheet 100.

The final step of the method according to the invention then consists of covering the electronic assembly with a second plastic sheet 700 and of performing a cold lamination. During this cold lamination, a liquid resin, of polyurethane type for example, is delivered in order to allow welding of the two plastic sheets 100 and 700 constituting the card body. With the residual air having been driven out around the electronic assembly, as a result of filling of the free spaces, air bubbles can no longer form at this stage of the manufacture.

By virtue of the method according to the invention, the number of independent elements is reduced to two. These independent elements are constituted by the first sheet 100 supporting the electronic assembly and by the second sheet 700.

The insulating bridge 300 provides electrical insulation between the tracks of the antenna 200 passing between the connection terminals 250 of this antenna as well as insulation of the metallic grid of the module 600. Without the presence of this insulating bridge, the metallic contact areas of the module would be in direct contact with the tracks of the antenna and would then create short circuits harmful to the normal operation of the electronic assembly. The insulating bridge also makes it possible to drive out the residual air between the antenna tracks and thus avoids the formation of air bubbles and surface defects.

What is claimed is:

1. A method for making a contactless chip support comprising an electronic assembly having an antenna and at least one microcircuit connected to the antenna, said electronic assembly being embedded in a support body composed of laminated sheets, comprising the following steps:

producing the antenna on a first support sheet, said antenna forming a spiral at the ends of which are provided connection terminals, producing an insulating bridge partly covering the antenna turns with the exception of at least part of the connection terminals, depositing a drop of filling material on the insulating bridge, the filling material driving out residual air between the insulating bridge and the microcircuit, attaching the microcircuit against the insulating bridge and the filling material, to thereby establish an electrical connection from the microcircuit to the connection terminals of the antenna, and attaching a second sheet against the electronic assembly and performing a lamination of said first and second sheets.

2. A method according to claim 1 wherein the filling material is a cyanoacrylate-based glue.

3. A method according to claim 1, wherein the insulating bridge is produced by silk screen printing of a liquid resin, and subsequent polymerization under ultraviolet radiation.

4. A method according to claim 1, wherein the insulating bridge has a thickness between 15 and 60 $\mu$m.

5. A method according to claim 1, wherein the electrical connection between the module and the antenna is implemented by means of an electrically conductive glue which is deposited on the connection terminals of the antenna.

6. A method according claim 1, wherein the antenna has a thickness between 10 and 40 $\mu$m.

7. A method according to claim 1, wherein the microcircuit is disposed in an electronic module so that metallic contact areas of the microcircuit are disposed against the insulating bridge and the filling material.

8. A method for making a contactless chip support comprising an electronic assembly having an antenna and at least one microcircuit a connected to the antenna, said electronic assembly being embedded in a support body composed of laminated sheets, comprising:

producing the antenna on a first support sheet, said antenna forming a spiral at the ends of which are provided connection terminals, producing an insulating bridge partly covering the antenna turns with the exception of at least part of the connection terminals, depositing a drop of filling material on the insulating bridge, the filling material driving out residual air between the insulating bridge and the microcircuit, attaching the microcircuit against the insulating bridge and the filling material, to thereby establish an electrical connection from the microcircuit to the connection terminals of the antenna, and attaching a second sheet against the electronic assembly and performing a lamination of said first and second sheets, wherein the insulating bridge has a substantially rectangular form and has two notches at two given locations to allow exposure of the connection terminals of the antenna.

9. A method for making a contactless chip support comprising an electronic assembly having an antenna and at least one electronic module connected to the antenna, said electronic assembly being embedded in a support body composed of laminated sheets, comprising the following steps:

producing the antenna on a first support sheet, said antenna forming a spiral at the ends of which are provided connection terminals, producing an insulating bridge partly covering the antenna turns with the exception of at least part of the connection terminals, depositing a drop of filling material on the insulating bridge, the filling material driving out the residual air between the insulating bridge and the electronic module, attaching the microcircuit against the insulating bridge and the filling material, to thereby establish an electrical connection from the integrated circuit chip to the connection terminals of the antenna, and attaching a second sheet against the electronic assembly and performing a lamination of said first and second sheets, wherein the electronic module comprises an integrated circuit chip.

10. A contactless chip card, having an electronic assembly constituted by an electronic module and an antenna connected to said module, said electronic assembly being embedded in the body of the card, such that the electronic assembly is fixed on a first support sheet on which the antenna is mounted, and the module has metallic contact areas that are disposed facing the antenna; and an insulating bridge covered with a filling material and disposed between the module and the antenna, wherein said filling material fills any space between the insulating bridge and the module and the filled space is devoid of residual air, said insulating bridge having a geometry such that the insulating bridge does not cover the connection terminals of the antenna to allow the establishment of an electrical connection with the electronic module.

11. A contactless chip card according to claim 10, wherein said filling material is a glue.

12. A contactless chip card according to claim 10, wherein said filling material is a cyanoacrylate glue.

13. A contactless chip card according to claim 10, wherein said insulating bridge has a plurality of notches to allow exposure of the connection terminals of the antenna.

14. A contactless chip card according to claim 10, wherein the insulating bridge has a substantially rectangular form and has two notches to allow exposure of the connection terminals of the antenna.

15. A contactless chip support comprising an electronic assembly having an antenna and at least one microcircuit connected to the antenna, the contactless chip support formed by:
   producing the antenna on a first support sheet, said antenna forming a spiral at the ends of which are provided connection terminals,
   producing an insulating bridge partly covering the antenna turns with the exception of at least part of the connection terminals,
   depositing a drop of filling material on the insulating bridge, wherein the filling material drives out residual air between the insulating bridge and the microcircuit,
   transferring the microcircuit against the insulating bridge and the filling material, to thereby establish an electrical connection from the microcircuit to the connection terminals of the antenna, and
   attaching a second sheet against the electronic assembly and performing a lamination of the first and second sheets.

16. A method for making a contactless chip support comprising an electronic assembly having an antenna and at least one microcircuit connected to the antenna, said electronic assembly being embedded in a support body composed of laminated sheets, comprising:
   producing the antenna on a first support sheet, said antenna forming a spiral at the ends of which are provided connection terminals,
   partly covering the antenna turns with an insulating bridge with the exception of at least part of the connection terminals,
   thereafter depositing a drop of filling material on the insulating bridge, the filling material driving out residual air between the insulating bridge and the microcircuit,
   thereafter attaching the microcircuit against the insulating bridge and the filling material, to thereby establish an electrical connection from the microcircuit to the connection terminals of the antenna, thereby forming an electronic assembly comprising the microcircuit and the antenna, and
   attaching a second sheet against the electronic assembly and performing a lamination of said first and second sheets.

17. A method according to claim 16, wherein the attaching a second sheet against the electronic assembly is performed after attaching the microcircuit against the insulating bridge and the filling material.

* * * * *